United States Patent
Calvin et al.

(10) Patent No.: US 9,838,001 B2
(45) Date of Patent: *Dec. 5, 2017

(54) METHODS FOR CONSOLIDATING MODULE TYPES FOR INDUSTRIAL CONTROL SYSTEMS

(71) Applicant: Bedrock Automation Platforms Inc., San Jose, CA (US)

(72) Inventors: James G. Calvin, Attleboro, MA (US); Albert Rooyakkers, Sunnyvale, CA (US)

(73) Assignee: Bedrock Automation Platforms Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/289,379

(22) Filed: Oct. 10, 2016

(65) Prior Publication Data

US 2017/0033781 A1 Feb. 2, 2017

Related U.S. Application Data

(63) Continuation of application No. 14/401,969, filed as application No. PCT/US2013/053716 on Aug. 6, 2013, now Pat. No. 9,465,379.

(51) Int. Cl.
*H03K 7/08* (2006.01)
*G05B 19/05* (2006.01)
*G05B 19/042* (2006.01)

(52) U.S. Cl.
CPC ........... *H03K 7/08* (2013.01); *G05B 19/0423* (2013.01); *G05B 19/056* (2013.01);
(Continued)

(58) Field of Classification Search
CPC ... H03K 7/08; H03K 9/08; H03K 9/10; G05B 19/056; G05B 19/0423;
(Continued)

(56) References Cited

U.S. PATENT DOCUMENTS 3,965,429 A 6/1976 Roberts, III
4,340,881 A 7/1982 Stack et al.
(Continued)

FOREIGN PATENT DOCUMENTS

CN 103095156 A 5/2013
EP 1020057 A1 7/2000
(Continued)

OTHER PUBLICATIONS

Pulse-Width Modulated Rectifiers; Fundamentals of Power Electronics; Chapter 18; pp. 1-100.
(Continued)

*Primary Examiner* — Nathan L Laughlin
(74) *Attorney, Agent, or Firm* — Advent, LLP

(57) ABSTRACT

A programmable discrete input module is described. In one or more implementations, the programmable discrete input module comprises a pulse width modulation module configured to generate a pulse width modulated signal based upon an input signal and a pulse width modulation module configured to generate a demodulated pulse width signal. An isolator is configured to isolate the pulse width modulation module and the pulse width demodulation module and to generate isolated modulated pulse width signal based upon the pulse width modulated signal for the pulse width demodulation module to generate the demodulated pulse width signal. The programmable discrete input module also includes a first comparator and a second comparator for comparing the demodulated pulse width signal with a respective programmable reference and a digital filter configured to filter a comparison signal output by the first comparator or the second comparator to generate a discrete input signal.

14 Claims, 6 Drawing Sheets

(52) U.S. Cl.
CPC .............. *G05B 2219/13004* (2013.01); *G05B 2219/25243* (2013.01); *G05B 2219/32404* (2013.01); *G05B 2219/42237* (2013.01)

(58) Field of Classification Search
CPC ........... G05B 2219/32404; G05B 2219/25243; G05B 2219/42237; G05B 2219/13004; G05B 2219/42238
See application file for complete search history.

(56) References Cited

U.S. PATENT DOCUMENTS

| | | | |
|---|---|---|---|
| 4,685,040 A | 8/1987 | Steigerwald et al. | |
| 5,274,375 A | 12/1993 | Thompson | |
| 5,777,235 A | 7/1998 | Altwein | |
| 5,818,708 A | 10/1998 | Wong | |
| 6,700,803 B2 | 3/2004 | Krein | |
| 7,345,464 B2 | 3/2008 | Steele | |
| 8,189,356 B2 | 5/2012 | Takahashi et al. | |
| 2002/0030871 A1* | 3/2002 | Anderson | H04B 1/385 398/132 |
| 2010/0079083 A1 | 4/2010 | Seguine | |
| 2010/0158157 A1 | 6/2010 | Iwata et al. | |
| 2010/0329364 A1 | 12/2010 | Giombanco et al. | |
| 2011/0286542 A1 | 11/2011 | Shelburne | |
| 2012/0068614 A1 | 3/2012 | Ng et al. | |
| 2012/0213314 A1* | 8/2012 | Subburaj | H04L 25/4902 375/340 |

FOREIGN PATENT DOCUMENTS

| | | | |
|---|---|---|---|
| JP | 6315511 | A | 1/1988 |
| JP | 0621823 | A | 1/1994 |
| JP | 2001199005 | A | 7/2001 |
| JP | 2001518749 | A | 10/2001 |
| JP | 2012070365 | A | 4/2012 |

OTHER PUBLICATIONS

Search Report and Written Opinion dated Apr. 25, 2014 for PCT/US2013/053716.

Dual Channel PWM Controller Module; INTEC Controls; Jun. 2002; Powey, CA; pp. 1-3.

Notice of Reasons for Rejection dated Jun. 21, 2017 for Japanese Patent Appln. No. 2016-533278.

Office Action dated Aug. 24, 2017 for EP Appln. No. 13890937.9.

* cited by examiner

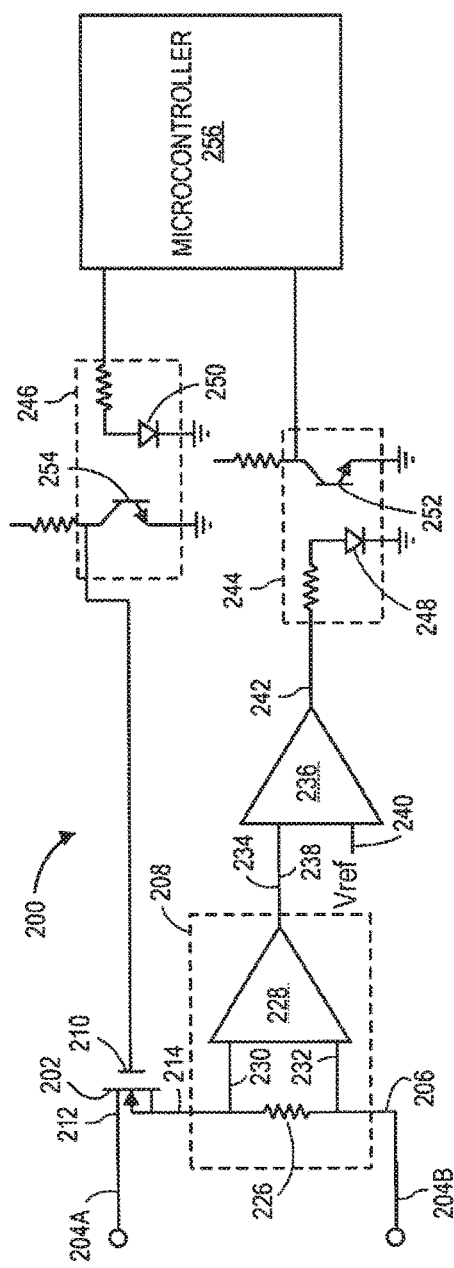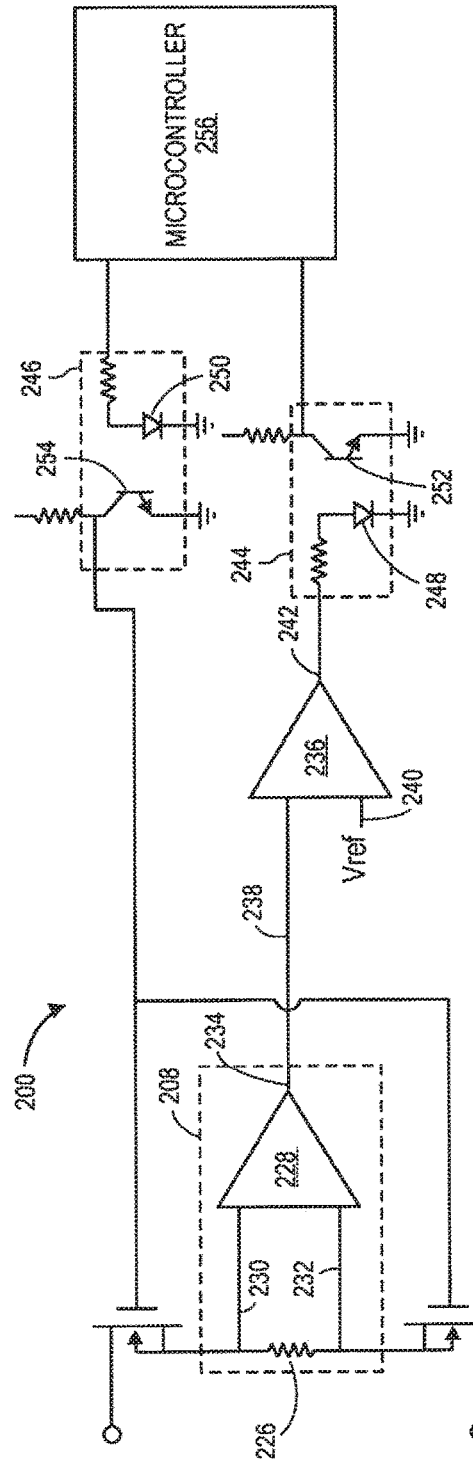
FIG. 3A
FIG. 3B

METHODS FOR CONSOLIDATING MODULE TYPES FOR INDUSTRIAL CONTROL SYSTEMS

CROSS-REFERENCE TO RELATED APPLICATIONS

The present application is a continuation under 35 U.S.C. §120 of U.S. application Ser. No. 14/401,969, entitled METHODS FOR CONSOLIDATING MODULE TYPES FOR INDUSTRIAL CONTROL SYSTEMS, filed on Nov. 18, 2014, which is a 371 Application of International Application No. PCT/US2013/53716, entitled METHODS FOR CONSOLIDATING MODULE TYPES FOR INDUSTRIAL CONTROL SYSTEMS, filed on Aug. 6, 2013 which are hereby incorporated by reference in their entirety.

BACKGROUND

Industrial control systems (ICS) encompass several types of industrial and process control systems used in a variety of industrial environments and critical infrastructures. Example industrial control systems (ICS) include, but are not limited to: Supervisory Control and Data Acquisition (SCADA) systems, Distributed Control Systems (DCS), and other control equipment using, for example, Programmable Logic Controllers (PLC) or the like. Using information collected from remote stations in the industrial or infrastructure environment, automated and/or operator-driven supervisory commands can be transmitted to remote station control devices. These control devices can control various local operations, such as opening and/or closing valves and circuit breakers, operating solenoids, collecting data from sensor systems, and monitoring a local environment for alarm conditions.

SUMMARY

A programmable discrete input module is described. In one or more embodiments, the programmable discrete input module comprises a pulse width modulation module configured to generate a pulse width modulated signal based upon an input signal and a pulse width demodulation module configured to generate a demodulated pulse width signal. An isolator is configured to isolate the pulse width modulation module and the pulse width demodulation module. The isolator generates an isolated modulated pulse width signal based upon, the pulse width modulated signal that is furnished to the pulse width demodulation module to generate the demodulated pulse width signal. A first comparator and a second comparator compare the demodulated pulse width signal with a respective programmable reference. A digital filter filters a comparison signal output by the first comparator or the second comparator to generate a discrete input signal.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the Detailed Description and the figures may indicate similar or identical items.

FIGS. 3A and 3B are circuit diagrams illustrating the programmable discrete output module shown in FIG. 2 in accordance with specific implementations of the present disclosure.

Figure 6:
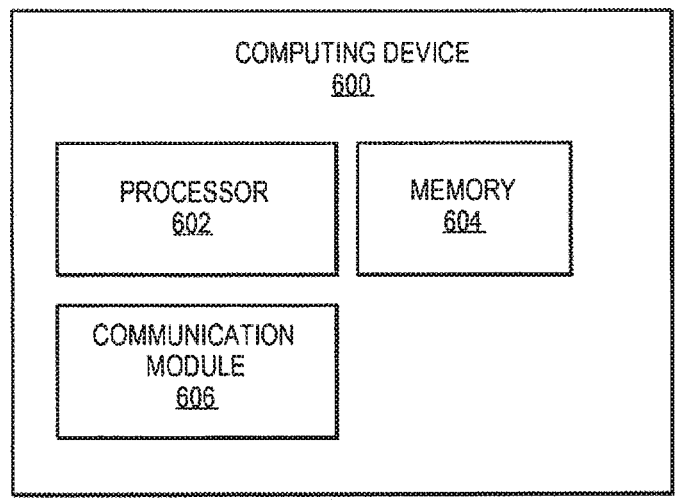
Figure 7:
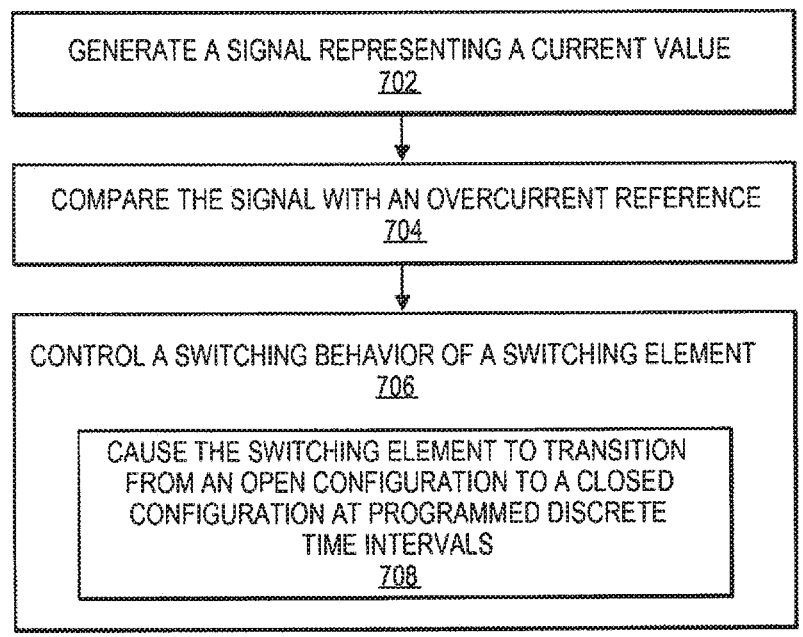

FIG. 6 is a block diagram illustrating a computing device in accordance with an example implementation of the present disclosure, wherein the computing device may be implemented as a field-programmable gate array device, an application-specific integrated circuit device, and so forth FIG. 7 is a flow diagram illustrating an example method for whether an overcurrent event has occurred in accordance with an example implementation of the present disclosure.

Figure 8:
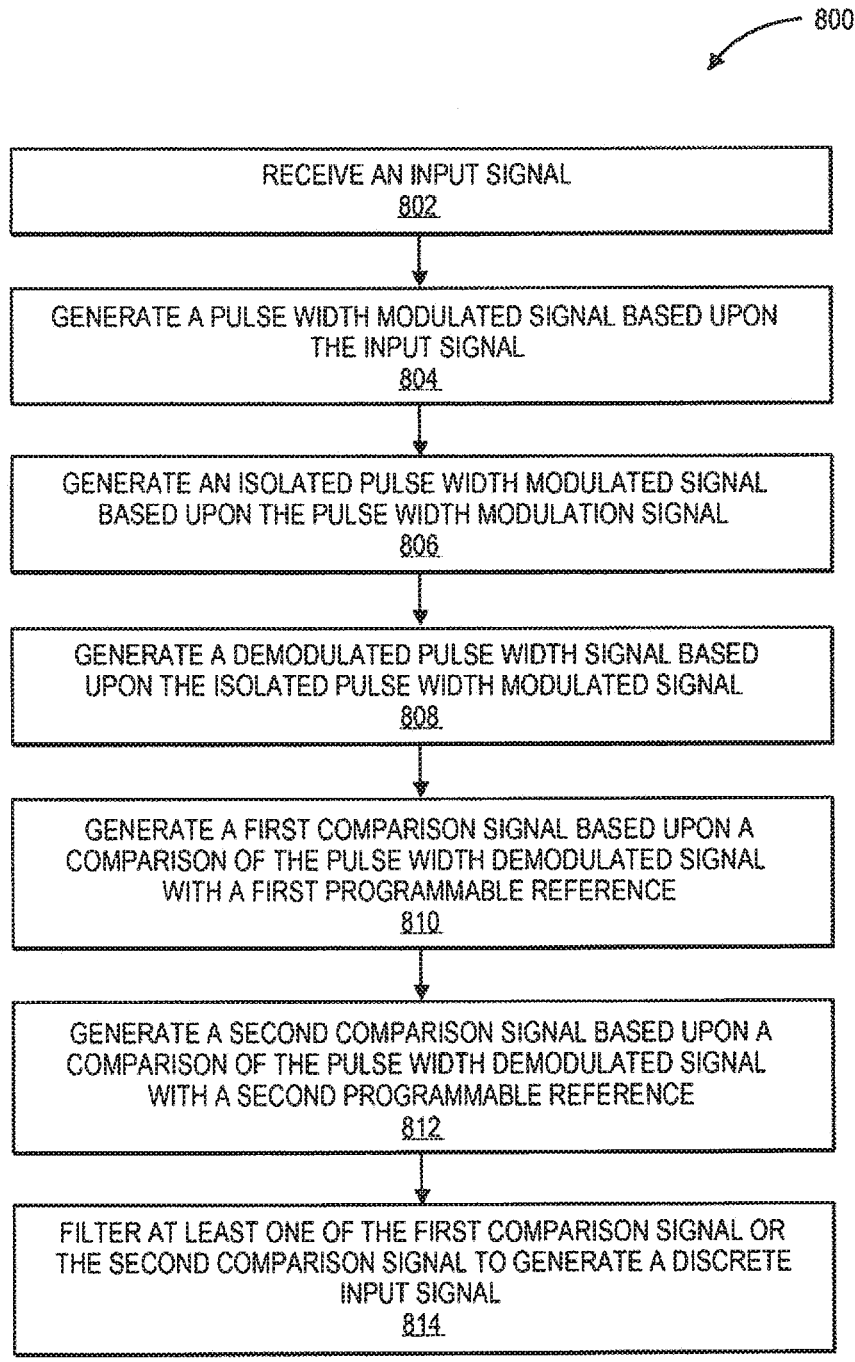

FIG. 8 is a flow diagram illustrating an example method for generating a discrete input signal in accordance with an example implementation of the present disclosure.

DETAILED DESCRIPTION

Overview

Industrial control systems/process control systems typically include input/output modules that are configured to interface with input instruments, or to transmit instructions to output instruments in the process or the field via a power backplane. For example, an input/output module may be used to interface with a process sensor for measuring a characteristic associated with the industrial process. In another instance, an input/output module may be used to interface with a motor for controlling operation of the motor. Consequently, a variety of input/output modules may be required to interface with the various input/output instrumentation of the system. For example, various instruments that interface with the input/output modules may operate at different voltage levels or voltage types. Thus, a particular instrument may require a dedicated input/output module. For example, a dedicated input-output module may be required for a first instrument (e.g., a sensor) operating at twenty-four volts (24 V) and another dedicated input/output module may be required for a second instrument (e.g., a motor) operating at two hundred and forty volts (240 V).

Accordingly, a programmable discrete output module is disclosed. In one or more implementations, the programmable discrete output module includes a current sensing circuit for generating a current sensing signal indicating current value. For example, the current sensing circuit may comprise a differential amplifier connected in parallel with an impedance element. The differential amplifier is configured to generate an output signal (e.g., current sensing signal) representing a voltage drop across the impedance element, which indicates a current flow through the current sensing circuit. The programmable discrete output module also includes a comparator configured to compare the current sensing signal with an overcurrent reference and generates a comparison signal indicating whether an overcurrent event has occurred. A microcontroller is electrically connected to the comparator and configured to control (e.g., behaviorally control) the switching element based upon one or more programmable parameters. The programmable parameters may dictate operation of the switching element based upon a load configured to interface with the programmable discrete output module and/or current conditions within the module. In embodiments, the programmable discrete output module includes one or more isolators for providing galvanic isolation to the programmable discrete output module.

One or more of the components within the programmable discrete output module may be implemented in hardware, software, firmware, combinations thereof, or the like. In some implementations, the programmable discrete output module is configured to interface with industrial control system components including, but not necessarily limited to, modules that operate at switching voltages of twenty-four volts (24V), forty-eight volts (48V), one hundred and twenty volts (120V), or two hundred and forty volts (240V). These components may also operate utilizing alternating current (AC) voltages or direct current (DC) voltages. Thus, the module can provide functionality typically associated with multiple independent modules (e.g., replacing the functionality of about eight (8) output modules with one (1) output module) and provide an AC/DC response without substantially comprising time.

A programmable discrete input module is also described. In one or more implementations, the programmable discrete input module comprises a pulse width modulation module configured to generate a pulse width modulated signal based upon an input signal and a pulse width demodulation module configured to generate a demodulated pulse width signal. An isolator is configured to isolate the pulse width modulation module and the pulse width demodulation module and to generate isolated modulated pulse width signal based upon the pulse width modulated signal for the pulse width demodulation module to generate the demodulated pulse width signal. The programmable discrete input module also includes a first comparator and a second comparator for comparing the demodulated pulse width signal with a respective programmable reference. A digital filter is configured to filter a comparison signal output by the first comparator or the second comparator to generate a discrete input signal.

The programmable discrete input module may utilize existing components to allow a user to select programmable references, or set points, as well as programmable hysteresis, which may reduce the cost of operation as compared to other programmable discrete output modules. One or more of the components within the programmable discrete output module may be implemented in hardware, software, firmware, combinations thereof, or the like. In some embodiments, the programmable discrete input module is configured to interface with industrial control system control components including, but not necessarily limited to, components that operate at switching voltages of twenty-four (24) volts, forty-eight (48) volts, one hundred and twenty (120) volts, or two hundred and forty (240) volts. These components may also operate utilizing alternating current (AC) voltages or direct current (DC) voltages. Thus, the programmable discrete input module can provide functionality typically associated with multiple independent programmable discrete input modules (e.g., replacing the functionality of about sixteen (16) cards with one (1) card) and provide an AC/DC response without substantially comprising time.

Example Industrial Control System/Process Control System

Figure 1:
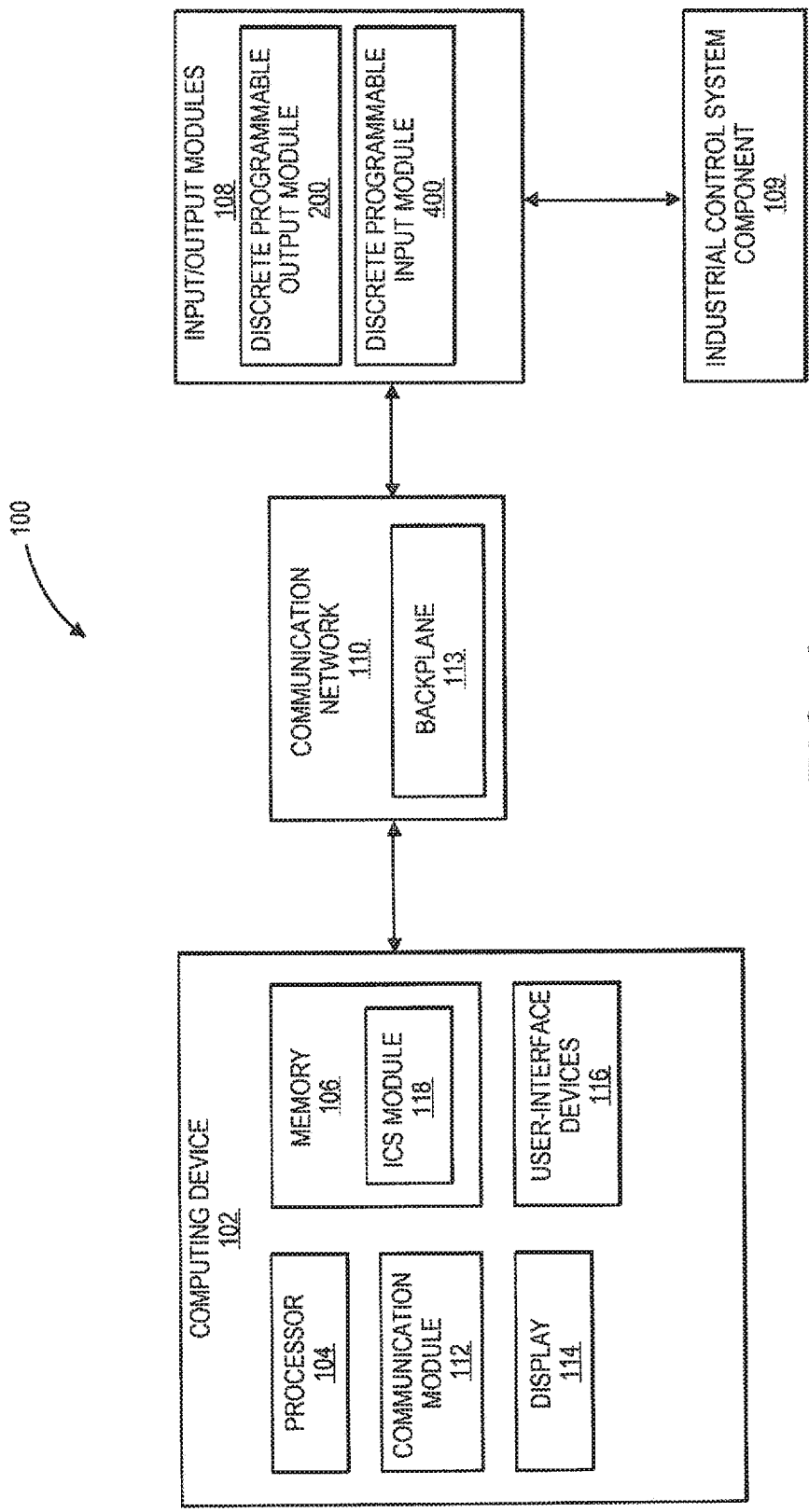
FIG. 1 is a block diagram illustrating an industrial control system in accordance with example implementation of the present disclosure.

FIG. 1 illustrates an industrial control system/process control system 100 for controlling or operating one or more industrial control system components (e.g., sensors, motors, etc.). In embodiments, the industrial control system/process control system 100 includes a computing device 102 that includes a processor 104 and a memory 106. The processor 104 provides processing functionality for the computing device 102 and may include any number of processors, micro-controllers, or other processing systems, and resident or external memory for storing data and other information accessed or generated by the computing device 102. The processor 104 may execute one or more software programs (e.g., modules) that implement techniques described herein.

The memory 106 is an example of tangible computer-readable media that provides storage functionality to store various data associated with the operation of the computing device 102, software functionality described herein, or other data to instruct the processor 104 and other elements of the computing device 102 to perform the steps described herein. Although a single memory 106 is shown within the computing device 102, a wide variety of types and combinations of memory may be employed. The memory 106 may be integral with the processor 104, stand-alone memory, or a combination of both. The memory may include, for example, removable and non-removable memory elements such as RAM, ROM, Flash (e.g., SD Card, mini-SD card, micro-SD Card), magnetic, optical, USB memory devices, and so forth.

The computing device 102 is communicatively coupled to one or more input/output (I/O) modules 108 (i.e., field devices, programmable discrete input/output devices, such as a programmable discrete output module 200 or a programmable discrete input module 400) over a communication network 110 via a communication module 112, which is included in the computing device 102. In a specific implementation of the present disclosure, the communication network 110 comprises a backplane 113 used to power and/or furnish communications with circuitry of the respective modules 200, 400. In other implementations, the communication network may at least partially comprise a variety of different types of networks and connections that are contemplated, including, but not limited to: switch fabric; the Internet; an intranet; a satellite network; a cellular network; a mobile data network; wired and/or wireless connections; and so forth.

Wireless networks may comprise any of a plurality of communications standards, protocols and technologies, including, but not limited to: Global System for Mobile Communications (GSM), Enhanced Data GSM Environment (EDGE), high-speed downlink packet access (HSDPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for email (e.g., internet message access protocol (IMAP) and/or post office protocol (POP)), instant messaging (e.g., extensible messaging and presence protocol (XMPP)), Session Initiation Protocol for Instant Messaging and Presence Leveraging Extensions (SIMPLE), and/or Instant Messaging and Presence Service (IMPS), and/or Short Message Service (SMS), or any other suitable communication protocol.

The I/O modules 108 are configured to interface with one or more industrial control system components 109, such as sensors and/or motors. The I/O modules 108 may comprise input modules, output modules, and/or input and output modules. For instance, input modules can be used to receive information from input instruments in the process or the field, while output modules can be used to transmit instructions to output instruments in the field. For example, I/O modules 108 can be connected to an industrial control system component 109 that comprises a process sensor for measuring pressure in piping for a gas plant, a refinery, and so forth. In implementations, the I/O modules 108 may be used to collect data and control systems in applications including, but not necessarily limited to: industrial processes, such as manufacturing, production, power generation, fabrication, and refining; infrastructure processes, such as water treatment and distribution, wastewater collection and treatment, oil and gas pipelines, electrical power transmission and distribution, wind farms, and large communication systems; facility processes for buildings, airports, ships, and space stations (e.g., to monitor and control Heating, Ventilation, and Air Conditioning (HVAC) equipment and energy consumption); large campus industrial process plants, such as oil and gas, refining, chemical pharmaceutical, food and beverage, water and wastewater, pulp and paper, utility power, mining, metals; and/or critical infrastructures. The I/O modules 108 may also be connected to an industrial control system component 109 that comprises a motor and configured to control one or more operating characteristics of the motor, such as motor speed, motor torque, and so forth. In other implementations, the industrial control system component 109 may comprise a valve and the I/O modules 108 is configured to control one or more operating characteristics of the valve, such as opening or closing the valve.

The communication module 112 may be representative of a variety of communication components and functionality, including, but not limited to: one or more antennas; a browser; a transmitter and/or receiver (e.g., radio frequency circuitry); a wireless radio; data ports; software interfaces and drivers; networking interfaces; data processing components; and so forth.

As shown in FIG. 1, the computing device 102 is communicatively coupled to a display 114 configured to display visual output to a user (e.g., an operator of the industrial control system/process control system 100, etc.). The visual output may include graphics, text, icons, video, and any combination thereof (collectively termed "graphics"). In some embodiments, some or all of the visual output may correspond to user-interface objects and the like. The computing device 102 may further be communicatively coupled to user-interface devices 116 (e.g., a keypad, a keyboard, buttons, a wireless input device, a thumbwheel input device, a trackstick input device, touchscreen, and so on) for furnishing communication functionality between the user and the system 100. The user-interface devices 116 may also include one or more audio I/O devices, such as a microphone, speakers, and so on. For example, the user may utilize the user-interface devices 116 to furnish input parameters to one or more programmable discrete input or programmable discrete output modules as described in greater detail herein.

The computing device 102 includes an industrial control system (ICS) module 118, which is storable in memory 106 and executable by the processor 104 (e.g., a non-transitory computer-readable medium embodying a program executable by the processor 108). As described in greater detail herein, the industrial control system module 118 is representative of functionality to facilitate the exchange of communication between the computing device 102 and the I/O modules 108, as well as control and/or provide operational parameters to the I/O modules 108 (e.g., the programmable discrete output module 200, the programmable discrete input module 400) based upon user-selected and/or user-defined input.

Example Programmable Discrete Output Modules

Figure 2:
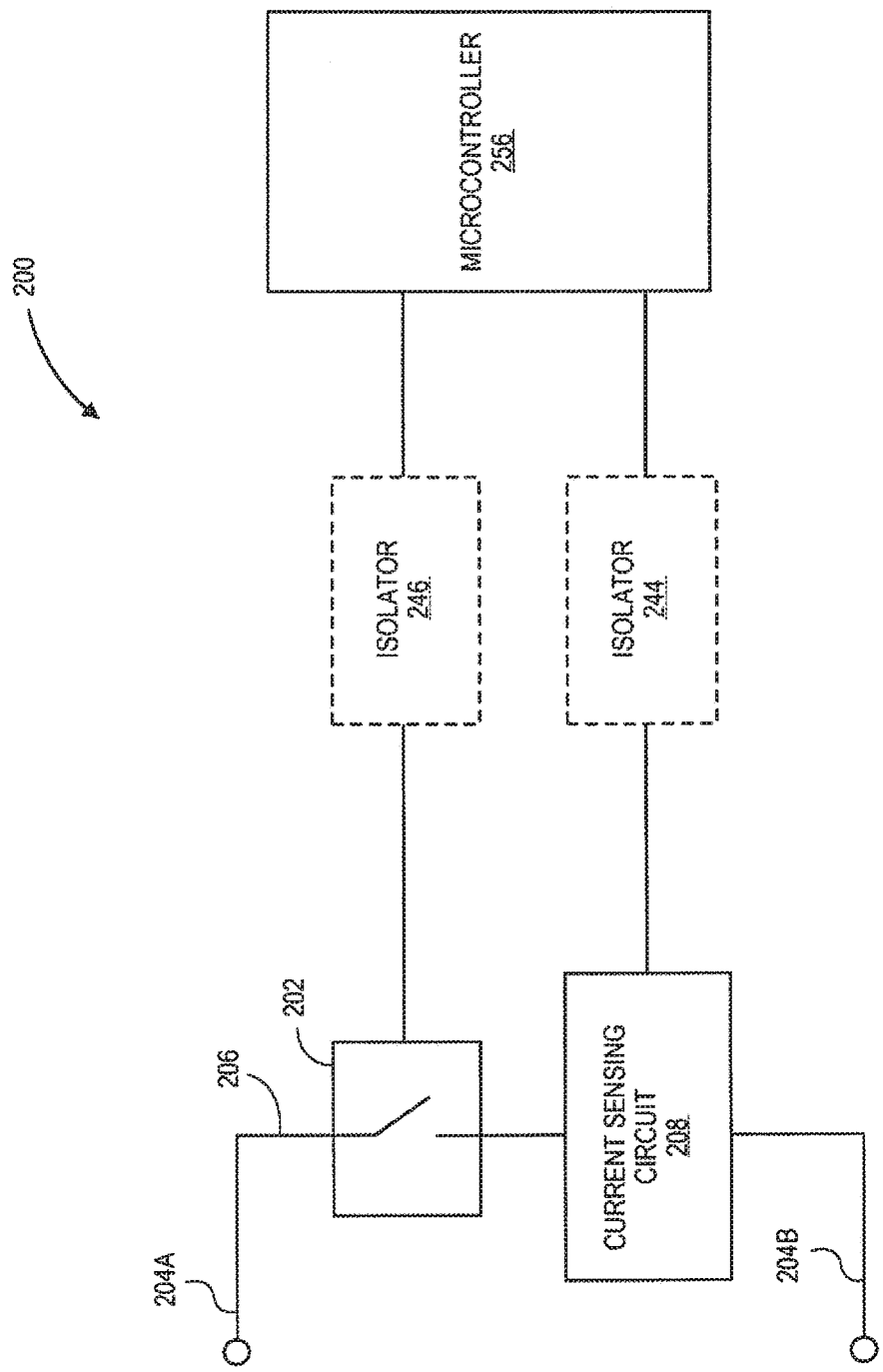
FIG. 2 is a block diagram illustrating a programmable discrete output module in accordance with an example implementation of the present disclosure.

FIGS. 2, 3A and 3B illustrate example programmable discrete output modules 200 in accordance with example implementations of the present disclosure. The programmable discrete output module 200 represents a discrete communication channel for the industrial control system/process control system 100. The programmable discrete output module 200 may be configured to interface with one or more industrial system control components, which may include, but is not limited to: temperature sensors, liquid tank sensors, pressure sensors, and the like. In an implementation of the present disclosure, the programmable discrete output module 200 is configured to operate industrial control system components, such as pumps, motor controllers, valves, and so forth. The programmable discrete output module 200 operates at various voltage levels, or excitations. For example, a first ICS component 109 may be configured to operate at a first voltage level, and a second ICS component 109 may be configured to operate at a second voltage level. In these examples, the same module 200 may be configured to interface with either component 109 upon receiving one or more programmable parameters. An alternating current (AC) voltage excitation may be twenty-four (24) volts, forty-eight (48) volts, one hundred and twenty (120) volts, or two hundred and forty (240) volts. In another example, the voltage excitation may be a direct current (DC) voltage excitation or an alternating current (AC) voltage excitation.

As shown in FIG. 2, the programmable discrete output module 200 includes at least one switching element 202 electrically connected to terminals 204A, 204B. The terminals 204A, 204B are configured to interface with the communication network 110, such as a backplane 113, configured to receive the programmable discrete output module 200. The switching element 202 has an open configuration that at least substantially prevents current flow within an electrical path 206 (e.g., a conductor, such as a wire, a trace, or the like) and a closed configuration to allow current flow within the electrical path 206. In one or more implementations, the switching element 202 may comprise one or more transistors such as metal-oxide-semiconductor field-effect transistors (MOSFETs), insulated-gate bipolar transistors, an electromechanical relay, or the like. For example, in a specific implementation, as shown in FIG. 3A, the switching element 202 comprises a power transistor 210, which includes a drain terminal 212, a source terminal 214, and a gate terminal 216. In this implementation, the module 200 is configured to interface with a communication network 110 having a direct current (DC) excitation configuration. In another specific implementation, as shown in FIG. 3B, the switch element 202 comprises a first power transistor 210 and a second power transistor 218. The second power transistor 218 includes a drain terminal 220, a source terminal 222, and a gate terminal 224. In this implementation, the module 200 is configured to interface with a ICS component 109 having an alternate current (AC) excitation configuration.

The switching element 202 is arranged in series with a current sensing circuit 208 along the electrical path 206. The current sensing circuit 208 is configured to furnish current sensing functionality to the programmable discrete output module 200. For example, the current sensing circuit 208 is configured to furnish overcurrent detection functionality to the programmable discrete output module 200. In a specific implementation, as shown in FIGS. 3A and 3B, the current sensing circuit 208 comprises an impedance element 226 within the electrical path 206 and a differential amplifier 228 electrically connected in parallel with the impedance element 226. As shown, the differential amplifier 228 includes a first input, voltage terminal 230, a second input voltage terminal 232, and an output terminal 234. The differential amplifier 228 is configured to amplify the voltage drop across the impedance element 226 and output a signal representing the amplified voltage drop. In one or more implementations, the impedance element 226 may comprise one or more resistors, an electrical trace having a known resistance, or one or more field-effect transistor devices. In one or more implementations, the differential amplifier 228 comprises an operational amplifier configured to furnish differential amplifier functionality to the module 200.

The programmable discrete output module 200 also includes a comparator 236 that is configured to furnish comparison functionality to the module 200. The comparator 236 includes a first input terminal 238, a second input terminal 240, and an output terminal 242. The first input terminal 238 is electrically connected to the output terminal 234 of the differential amplifier 228, and second input terminal 240 is electrically connected to a reference signal such as a reference voltage. The comparator 236 compares the amplified voltage drop signal to the reference signal. When the amplified voltage drop signal is greater than the reference signal, the comparator is configured to output a first signal, such as a logic high (e.g., logic "1") signal at the output terminal 242. Conversely, when the amplified voltage drop signal is less than the reference signal, the comparator 236 is configured to output a second signal, such as a logic low (e.g., logic "0") signal. The first signal may thus represent a condition that the current measured across the impedance element 226 exceeds a predefined threshold (e.g., an overcurrent event), and the second signal may represent the condition that the current measured across the impedance element 226 does not exceed the predefined threshold. In one or more implementations, the comparator 236 may be implemented in hardware (e.g., as a digital comparator) or in software (e.g., a processor having memory including computer-readable medium embodying a program of instructions executable by the processor to cause the processor to furnish comparison functionality).

As shown in FIG. 2, the programmable discrete output module 200 includes a first isolator 244 and a second isolator 246. The isolators 244, 246 are configured to furnish galvanic isolation to the programmable discrete output module 200. In a specific implementation, as shown in FIGS. 3A and 3B, the isolators 244, 246 may comprise a respective optical transmitter 248, 250 and a corresponding optical sensor (e.g., an optical receiver) 252, 254. In such implementations, the optical transmitters 248, 250 are configured to emit electromagnetic radiation in a limited spectrum of wavelengths. For example, the optical transmitters 248, 250 may emit electromagnetic radiation occurring in the non-visible light spectrum (e.g., infrared spectrum, radio frequency spectrum, etc.) or to emit electromagnetic radiation occurring in the visible light spectrum. The optical sensor 252 of the first isolator 244 is configured to detect electromagnetic radiation emitted by the optical transmitter 248 and convert the electromagnetic radiation into signal, e.g., an isolated comparator signal, that represents the comparator signal.

In embodiments, the optical transmitters 248, 250 may comprise, but are not limited to one or more light emitting diodes, one or more laser diodes, or the like. The output signal of the comparator 236 is configured to drive the optical transmitter 248 of the first isolator 244. For example, the optical transmitter 248 may be configured to emit electromagnetic radiation in a limited spectrum of wavelengths that represent the output signal of the comparator 236. In embodiments, the optical sensors 252, 254 comprises photodetectors, such as photodiodes, phototransistors, or the like, that convert the detected electromagnetic radiation into corresponding electrical signals.

The programmable discrete output module 200 also includes a microcontroller 256 that is electrically connected to the isolators 244, 246. The microcontroller 256 may furnish dedicated processing functionality to the module 200. As shown in FIGS. 3A and 3B, the optical sensor 252 of the first isolator 244 is electrically connected to the microcontroller 256, and the microcontroller 256 is electrically connected to the optical transmitter 250 of the second isolator 246. In one or more implementations, the microcontroller 256 includes at least one processor configured to furnish processing functionality to the microcontroller 256 and memory configured to store one or more modules (e.g., computer programs) executable by the processor.

The microcontroller 256 operates the switching element 202 based upon the isolated comparator signal. In an implementation, the microcontroller 256 is configured to control the switching behavior of the switching element 202 based upon one or more programmable parameters. In embodiments, the microcontroller 256 may include programmable parameters corresponding to a load, or load type, configured to interface with the programmable discrete output module 200. For example, when the microcontroller 256 receives a signal indicating an overcurrent event has occurred, the microcontroller 256 is configured to output a microcontroller signal to cause the switching element 202 to transition to the open configuration. In this example, the microcontroller 256 generates and outputs a microcontroller signal that drives the optical transmitter 250, which emits electromagnetic radiation in a limited spectrum of wavelengths that represents the microcontroller signal. The optical sensor 254 detects the electromagnetic radiation in a limited spectrum of wavelengths representing the microcontroller signal and generates a signal, an isolated microcontroller signal, based upon the detected electromagnetic radiation.

The isolated microcontroller signal causes the switching element 202 to transition from the closed configuration to the open configuration. For example, as shown in FIGS. 3A and 3B, the optical sensor 254 is electrically connected to the gate terminal 216 (and/or the gale terminal 224) of the power transistor 210 (and/or the second power transistor 218). When an overcurrent event is occurring, the isolated microcontroller signal is configured to cause the power transistor 210 (and/or the power transistor 218) to transition from an operational state (e.g., active mode or triode mode) to a substantially non-operation state (e.g., cutoff mode) to at least substantially prevent current flow within the electrical path 206. When no overcurrent event has occurred, the switching element 202 may be maintained in the closed configuration.

The microcontroller 256 is configured to control the switching behavior of the switching element 202 based upon the load type interfaced with the terminals 204A, 204B. For example, a user may furnish, or select, one or more programmable parameters that instruct the microcontroller 256 how to respond during an overcurrent event based upon the load type (e.g., soft selectable overcurrent behavior). Thus, a user of the system 100 may tailor the behavior of the switching element 202 to the load of the module 200. In an implementation, based upon the load type, the microcontroller 256 may cause the switching element 202 to transition to the closed configuration at programmed discrete time intervals for a programmed amount of times in response to receiving an indication of an overcurrent event. In another implementation, depending on the load type, the microcontroller 256 is configured to prevent the switching element 202 from transitioning back to the closed configuration due to an overcurrent event.

The industrial control system 100 may employ multiple programmable discrete output modules 200 that are each configured to communicate with the computing device 102 via the communication network 110 (e.g., the backplane 113). The backplane 113 provides power and/or communication signal transmissions between the modules 200 and the computing device 102. In one or more implementations, respective ones of the channels, or respective modules 200, may be programmed with different programmable parameters for controlling a switch behavior of the respective module 200. In another implementation, each channel may be programmed with the same programmable parameters for controlling the switch behavior of the respective module 200. Thus, the modules 200, or channels, are each individually programmable based upon the load type to interface with the module 200.

Example Programmable Discrete Input Modules

Figure 4:
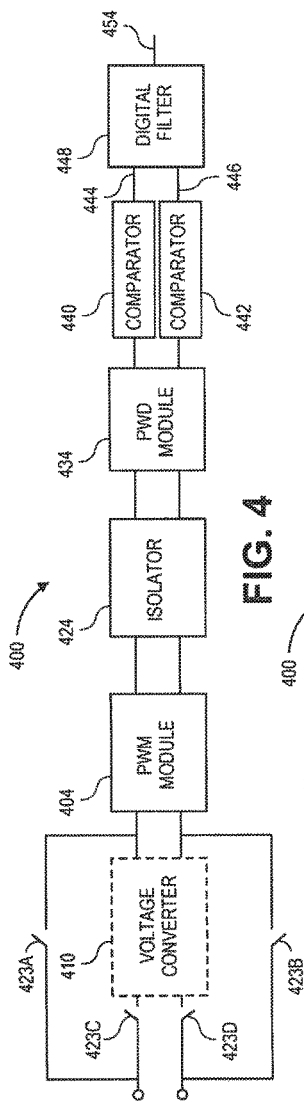
FIG. 4 is a block diagram illustrating a programmable discrete input module in accordance with an example implementation of the present disclosure.
Figure 5:
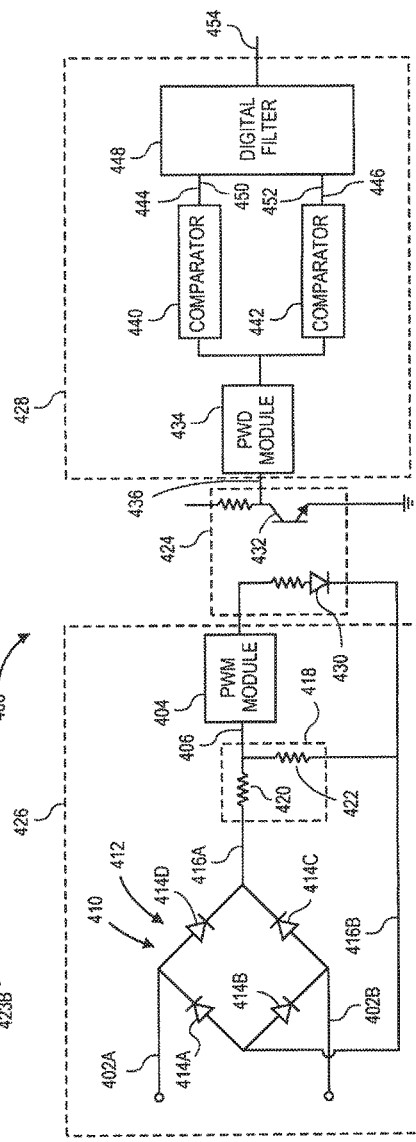
FIG. 5 is a circuit diagram illustrating the programmable discrete input module shown in FIG. 4 in accordance with a specific implementation of the present disclosure.

FIGS. 4 and 5 illustrate example programmable discrete input modules 400 in accordance with example implementations of the present disclosure. The programmable discrete input module 400 may represent a discrete communication channel for the industrial control system 100 configured to interface with one or more industrial system control components, which may include, but is not limited to: temperature sensors, liquid tank sensors, pressure sensors, and the like. The programmable discrete input modules 400 are configured to receive input signals at input terminals 402A, 402B that represent an input parameter of the industrial control system 100. For example, the input signal may represent a temperature parameter provided by a temperature sensor associated with the industrial control system 100. In another example, the input signal may represent a liquid level within a tank provided by a liquid sensor associated with the industrial control system 100. In yet another example, the input signal may represent a pressure parameter provided by a pressure sensor associated with the industrial control system 100. The module 400 is configured to interface with ICS components that operate at differing voltage inputs (e.g., voltage excitations) based upon one or more programmable parameters furnished to the module 400. For example, an alternating current (AC) voltage excitation may be twenty-four volts (24V), forty-eight (48V), one hundred and twenty (120V) volts, or two hundred and forty (240V). The voltage excitation may be a direct current (DC) voltage input or an alternating current (AC) voltage input.

As shown, the programmable discrete input module 400 includes a pulse width modulation module 404 having an input terminal 406 and an output terminal 408. The pulse width modulation module 404 is configured to generate a pulse width modulation signal based upon the input signal at the input terminal 406. In some embodiments, the pulse width modulation module 404 is communicatively connected to a voltage converter 410. In such embodiments, the voltage converter 410 is electrically connected to the input terminals 402A, 402B. The converter 410 is configured to receive an analog current (AC) input signal (e.g., an AC voltage signal) at the input terminals 402A, 402B and convert the analog current (AC) input signal to a corresponding direct current (DC) output signal.

In a specific implementation, the converter 410 comprises a bridge rectifier 412. The bridge rectifier 412 includes at least four diodes 414A, 414B, 414C, 414D arranged in a bridge configuration (i.e., a diode bridge). However, it is contemplated that other types of voltage converter devices may be utilized in place of the bridge rectifier 412. As shown in FIG. 5, the bridge rectifier 412 includes output terminals 416A, 416B that furnish the converted output signal to a voltage divider 418. The voltage divider 418 is configured to generate an output signal that is a portion of the input signal (i.e., the converted signal). As shown, the voltage divider 418 includes at least two impedance elements 420A, 420B configured to attenuate the input signal as a function of the impedance element values. The impedance element values may be selected according to the requirements of the system 100. In a specific implementation, the impedance elements 420, 422 are resistors. The voltage divider 418 is electrically connected to the pulse width modulation module 404. As described above, the pulse width modulation module 404 is configured to generate a pulse width modulated signal at the output terminal 408 as a function of the signal furnished at the input terminal 406 (i.e., the signal furnished by the voltage divider 418). In some embodiments, a user (e.g., an operator) of the industrial control system 100 can select an input voltage detection mode of operation based upon the type of voltage input (e.g., AC voltage input signal or DC voltage input signal) to the module 400. For example, the ICS module 118 is configured to cause the processor 104 to cause the display of graphical representation of the voltage type to be input to the module 400. The user may utilize a user interface device 116 to cause the module 118 to select the voltage input that the module 400 is to monitor. Based upon the selection, the module 118 is configured to cause the processor 104 to enable operation of the converter 410 when the voltage input is AC or to disable operation of the converter 410 when the voltage input signal is DC. When the converter 410 is disabled, the input terminals 402A, 402B are directly connected to the pulse width modulation module 404 such that the DC voltage input signal is furnished directly to the pulse width modulation module 404. The processor 104 may be configured to control operation of the switches 423A, 423B, 423C, 423D such that the switches 423A, 423B are in an open configuration to prevent a direct connection between the input terminals 402A, 402B (switches 423C, 423D are in a closed configuration) and the module 404 when the voltage input is AC and the switches 423A, 423B are in a closed configuration to directly connect the input terminals 402A, 402B and the module 404 (switches 423C, 423D are in the open configuration) when the voltage input is DC.

In embodiments, the pulse width modulation module 404 may also be directly connected with the input, terminals 402A, 402B. In such embodiments, the pulse width modulation module 404 is configured to receive the AC input signal and digitally filter the AC signal to generate a direct current signal for the pulse width module 404.

As shown in FIG. 4, the programmable discrete input module 400 includes an isolator 424 configured to furnish galvanic isolation to the programmable discrete input module 400. The isolator 424 isolates a first portion 426 of the programmable discrete input module 400 from a second portion 428 of the programmable discrete input module 400. As shown, the pulse width modular module 404 is electrically connected to the isolator 424, and the pulse width modulated signal is furnished to the isolator 424. The isolator 424 is configured to allow the exchange of electrical energy (e.g., electrical energy representing information, electrical energy representing data) between the first portion 426 and the second portion 428. In an implementation, the isolator 424 comprises an optical transmitter 430 and an optical sensor 432 (e.g., an optical sensor). For example, as shown in FIG. 5, the pulse width modulated signal drives an optical transmitter 430 configured to emit electromagnetic radiation in a limited spectrum of wavelengths that represent the pulse width modulated signal. For example, the optical transmitter 430 is configured to emit electromagnetic radiation occurring in the non-visible light spectrum (e.g., infrared spectrum, radio frequency spectrum, etc.) or to emit electromagnetic radiation occurring in the visible light spectrum. The optical transmitter 430 may comprise, but is not limited to one or more light emitting diodes, one or more laser diodes, or the like.

The optical sensor 432 is configured to detect electromagnetic radiation emitted by the optical transmitter 430 and convert the electromagnetic radiation into an isolated modulated pulse width signal, such as an electrical signal, representing the pulse width modulated signal. In one or more implementations, the optical sensor 432 comprises photodetectors, such as photodiodes, phototransistors, or the like, that convert the detected electromagnetic radiation into the isolated modulated pulse width electrical signal.

As shown in FIG. 4, the programmable discrete input module 400 includes a pulse width demodulation module 434 having an input terminal 436 and an output terminal 438. As shown in FIG. 4, the input terminal 436 is electrically coupled to the isolator 424. In a specific implementation, as shown in FIG. 5, the input terminal 436 is electrically connected to the optical sensor 432. The pulse width demodulation module 434 is configured to generate a pulse width demodulation signal based upon the isolated modulated pulse width signal at the input terminal 436.

The programmable discrete input module 400 also includes at least a first comparator 440 and a second comparator 442. As described herein in greater detail, the comparators 440, 442 are software settable. For example, the comparators 440, 442 include programmable thresholds (e.g., reference points) and programmable hysteresis. The comparators 440, 442 may be implemented in a variety of ways. For example, the comparators 440, 442 may be implemented in the comparators 440, 442 may be implemented in hardware (e.g., digital comparators). In another example, the comparators 440, 442 may be implemented in software (e.g., program executable instructions) that cause a processor to furnish comparison functionality.

The first comparator 440 and the second comparator 442 furnish comparison functionality to the system 100. As shown in FIG. 4, the first comparator 440 is electrically connected to the first output terminal 438 of the pulse width demodulation module 434. Similarly, the second comparator 442 is electrically connected to the second output terminal 440 of the pulse width demodulation module 434. The first comparator 440 and the second comparator 442 are also operatively connected with the processor 104 via the backplane 113. For instance, the first comparator 440 is connected to the backplane 113 via an input terminal 446, and the second comparator 442 is connected to the communication network 110 via an input terminal 448. In an implementation of the present disclosure, the system 100 is configured to provide a programmable reference, or set point, to the first comparators 440 and the second comparator 442. A user, or an operator, may select a first programmable reference for the first comparator 440. Similarly, the user may select a second programmable reference for the second comparator 442. For example, the ICS module 118 (e.g., computer-readable program) is configured to cause the processor 104 to cause the display of a set of programmable references (i.e., pre-defined programmable references according to the design of the system 100 and the programmable discrete input module) at the display 114 that the user may select from.

The user may utilize a user-interface device 116 to select the programmable references (e.g., the first programmable set point, or threshold, and the second programmable set point, or threshold) from the set of programmable references. In response to the user selections, the module 118 is configured to cause the processor 104 to set the programmable references of the corresponding comparator 440, 442. In an implementation, the setting of the first programmable reference may be different than the setting of the second programmable reference. For instance, the first programmable reference may represent a high set point, and the second programmable reference may represent a low set point. The programmable reference values may be based upon (i.e., correspond to) the type of voltage excitation value (i.e., twenty-four volts (24V), forty-eight volts (48V), one hundred and twenty volts (120V), or two hundred and forty volts (240V) at the input terminals 402A, 402B.

The comparators 440, 442 are configured to compare the demodulated pulse width signal at the corresponding terminals 438, 440 with the respective programmable reference (i.e., the respective set point). For example, the first comparator 440 is configured to compare the demodulated pulse width signal with the first programmable reference. When the demodulated pulse width signal is greater than the first programmable reference, the first comparator 440 is configured output a first signal (e.g., a logic high signal), which is indicative that the input signal at the input terminals 402A, 402B is greater than the previous input signal at terminals 402A, 402B. The previous input signal may be representative of a parameter of the industrial environment associated with the system 100 (e.g., temperature, liquid level pressure, etc.) during a previous discrete time period. When the demodulated pulse width signal is less than the first programmable reference, the first comparator is configured to output a second signal (e.g., a logic low signal), which is indicative that the input signal at the input terminals 402A, 402B is at least approximately the same as the previous input signal at terminals 402A, 402B.

The second comparator 442 is configured to compare the demodulated pulse width signal with the second programmable reference. When the demodulated pulse width signal is greater than the second programmable reference, the second comparator 442 is configured output a third signal (e.g., a logic high signal), which is indicative that the input signal at the input terminals 402A, 402B is at least approximately the same as the previous input signal at terminals 402A, 402B. When the demodulated pulse width signal is less than the second programmable reference, the second comparator 442 is configured output a fourth signal (e.g., a logic low signal), which is indicative that the input signal at the input terminals 402A, 402B is less than the previous input signal at terminals 402A, 402B.

As shown in FIGS. 4 and 5, the programmable discrete input module 400 includes a digital filter 448 having input terminals 450, 452 and an output terminal 454. The digital filter 448 is configured to furnish digital filter functionality to the module 400. The digital filter 448 is electrically connected to the output terminals 444, 446 of the respective comparator 440, 442. The digital filter 448 digitally filters the signals received by the comparators 440, 442 and generates a discrete input signal. The discrete input signal is furnished to the system 100 and is indicative of whether the input signal at the terminals 402A, 402B is greater than, at least approximately the same, or less than a previously sampled input signal at the terminals 402A, 402B. For example, the discrete input signal is indicative of whether an environment associated with the industrial control system 100 has changed over a time interval in one or more implementations, the output terminal 454 is communicatively connected to the processor 104 via the communication network 110, which utilizes the discrete input signal in accordance with the requirements of the industrial control system procedures.

In one or more implementations, the system 100 may employ multiple programmable discrete input modules 400 that are each configured to communicate with the computing device 102 via the communication network 110. For example, the communication network 110 may comprise a backplane (e.g., a power backplane) that is configured to interface with the programmable discrete input modules 400. Respective programmable input devices 400 represent channels within the system 100. The backplane is configured to provide power and/or communication signal transmissions between the devices 400 and the computing device 102. The devices 400 may receive input signals representing data collected from various modules 109 associated with the system 100. For example, a first module 400 (e.g., a first channel) may receive input signals representing a temperature within a tank. Similarly, a second module 400 (e.g., a second channel) may receive input signals representing a fluid level within the tank. In this example, the first module 400 may receive input signals occurring at a first excitation level (e.g., forty-eight volts (48V)), while the second module 400 may receive input signal occurring at a second excitation level (e.g., two-hundred and forty volts (240V)). The devices 400 (e.g., the channels) are configured to receive software selectable parameters (i.e., programmable thresholds, programmable hysteresis) from a user. Thus, the user cart provide software selectable parameters to each device, or each channel, according to the environmental monitoring requirements of the system 100.

FIG. 6 illustrates a computing device 600 in accordance with an example implementation of the present disclosure. As shown, the computing device 600 includes a processor 602 and a memory 604, and a communication module 606, which are configured to furnish at least the same functionality as the processor 104, memory 106, and the communication module 112 described above. For instance, the memory 604 includes a computer-readable medium embodying a program executable by the processor 602 to cause the processor 602 to perform one or more processes as described herein. In an implementation of the present disclosure, the computing device 600 is representative of a field-programmable gate array, a microcontroller, an application-specific integrated circuit device, combinations thereof, or the like.

It is contemplated that one or more of the above described devices may be implemented in software, hardware, firmware, combinations thereof, or the like. For instance, the pulse width modulation module 404 may be implemented as a computing device 600 embodied within a single, discrete integrated circuit device (i.e., a microcontroller) configured to furnish pulse width modulation functionality. In another instance, the pulse width demodulation module 434, the comparators 440, 442, and/or the digital filter 448 may be implemented in software or in hardware. For example, the pulse width demodulation module 434, the comparators 440, 442, and/or the digital filter 448 may be implemented within one or more computing devices 600 (i.e., implemented as an application-specific integrated circuit device, a microcontroller, or multiple integrated circuit devices). In another example, the functionality of the pulse width demodulation module 434, the comparators 440, 442, and/or the digital filter 448 may be furnished by software. For instance, functionality of the pulse width demodulation module 434, the comparators 440, 442, and/or the digital filter 448 may be implemented as program executable instructions, which may be stored in a tangible media such as memory 604, that cause the processor 602 to furnish the respective functionality of the corresponding components (the pulse width demodulation module 434, the comparators 440, 442, or the digital filter 448).

Example Methods

FIG. 7 illustrates an example method 700 for determining whether an overcurrent event has occurred. In the method 700 illustrated, a signal representing a current value (e.g., a voltage drop) is generated at a current sensing circuit (Block 702). In one or more implementations, a current sensing circuit 208 is configured to sense a current along an electrical path 206. As described above, a differential amplifier 228 is configured to amplify the voltage drop across the impedance element 226 and output a signal representing the amplified voltage drop. As shown in FIG. 6, the signal representing the amplified voltage drop is compared with an overcurrent reference (Block 704). As shown in FIGS. 3A and 3B, the comparator 236 is configured to compare the amplified voltage drop signal with an overcurrent reference (i.e., a voltage reference). If the amplified voltage drop signal is greater than the overcurrent reference, the comparator 236 is configured to output a signal indicating an overcurrent event has occurred. If the amplified voltage drop signal is less than the overcurrent reference, the comparator 236 is configured to output a signal indicating no overcurrent reference has occurred.

A switching behavior of a switching element is controlled by a microcontroller (Block 706). As described above, the microcontroller 256 is configured to control operation (i.e., switching behavior) of the switching element 202. When the microcontroller 256 receives a signal indicating an overcurrent event has occurred, the microcontroller 256 is configured to control operation of the switching element 202. For example, the microcontroller 256 is configured to cause the switching element 202 to transition from a closed configuration to an open configuration to prevent the flow of current through the electrical path 206. In some implementations, the microcontroller 256 included programmable parameters for instructing the microcontroller 256 to function based upon one or more load parameters. As shown in FIG. 7, in response to receiving a signal indicating an overcurrent event, the microcontroller is configured to cause the switching element to transition from the open configuration to the closed configuration at programmed discrete time intervals for a programmed amount of times (Block 708). For example, depending upon a load type interfaced with the module 200, the microcontroller 256 is configured to cause the switching element 202 to transition to the closed configuration at programmed discrete time intervals for a programmed amount of times in response to receiving an indication of an overcurrent event. In other examples, depending on the load type, the microcontroller 256 is configured to prevent the switching element 202 from transitioning back to the closed configuration due to an overcurrent event.

FIG. 8 illustrates a method 800 for generating a discrete input signal utilizing the programmable discrete input module 200 described above. As shown in FIG. 8, an input signal is received (Block 802). The module 200 is configured to be interfaced with one or more I/O modules 108, such as sensors 109 within an industrial control system environment. A pulse width modulated signal based upon the input signal is generated at a pulse width modulation module (Block 804). As described above, a pulse width modulation module 204 is configured to generate a pulse width modulation signal based upon the input signal.

An isolated pulse width modulated signal based upon the pulse width modulation signal is generated by an isolator (Block 806). The isolator 424 is configured to generate an isolated signal for demodulation by the pulse width demodulation module. For example, an optical transmitter 430 is configured to emit electromagnetic radiation within a spectrum of limited wavelengths based upon the pulse width modulated signal. The optical sensor is configured to detect the electromagnetic radiation and generate an isolated signal based upon the detected electromagnetic radiation.

A demodulated pulse width signal based upon the isolated pulse width modulated signal is generated (Block 808). As described above, the isolated signal is demodulated by the pulse width demodulation module 434. As shown in FIG. 7, a first comparison signal is generated based upon a comparison of the pulse width demodulated signal with a first programmable reference (Block 810), and a second comparison signal is generated based upon a comparison of the pulse width demodulated signal with a second programmable reference (Block 812). A first comparison signal and a second comparison signal are generated by a first comparator and a second comparator, respectively, based upon a comparison of a corresponding first programmable reference and a second programmable reference. The first programmable reference and the second programmable reference may be user-selectable such that a user can select a set point. The set point may be bused upon a voltage excitation associated with the module 200. At least one of the first comparison signal or the second comparison signal is filtered at a digital filter to generate a discrete input signal (Block 814). As described above, a digital filter filters the first comparison signal or the second comparison signal to generate a discrete input signal for the system 100.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A programmable discrete input hardware module comprising:
    an isolator configured to isolate a pulse width modulated signal received from a pulse width modulation module configured to generate the pulse width modulated signal based upon an input signal and a demodulated pulse width signal received from a pulse width demodulation module, the isolator configured to generate an isolated modulated pulse width signal based upon the pulse width modulated signal and to provide the isolated modulated pulse width signal to the pulse width demodulation module to generate the demodulated pulse width signal;
    a first comparator configured to compare the demodulated pulse width signal with a first programmable reference, the first comparator configured to output a first comparator output signal based upon the comparison;
    a second comparator configured to compare the demodulated pulse width signal with a second programmable reference, the second comparator configured to output a second comparator output signal based upon the comparison; and
    a digital filter communicatively coupled to the first comparator and the second comparator, the digital filter configured to digitally filter at least one of the first comparator output signal or the second comparator output signal to generate a discrete input signal.

2. The programmable discrete input hardware module as recited in claim 1, wherein the digital filter comprises a microcontroller including a processor coupled with a memory having tangible computer-readable medium embodying a program executable by the processor to cause the processor to furnish digital filter functionality.

3. The programmable discrete input hardware module as recited in claim 1, wherein at least one of the first programmable reference or the second programmable reference comprise a user-selectable programmable reference configured to be programmed by a user to select a set point associated with the at least one of the first programmable reference or the second programmable reference.

4. The programmable discrete input hardware module as recited in claim 1, wherein the isolator comprises an optical transmitter configured to emit electromagnetic radiation in a limited spectrum of wavelengths based upon the pulse width modulated signal and an optical sensor configured to detect the electromagnetic radiation in the limited spectrum of wavelengths, the optical sensor configured to generate the isolator signal in response thereto.

5. The programmable discrete input hardware module as recited in claim 1, further comprising a voltage converter having an input terminal and an output terminal, the output terminal communicatively coupled to the pulse width modulation module, the voltage converter configured to convert an analog voltage signal at the input terminal to a direct current signal at the output terminal, the direct current signal comprising the input signal.

6. A programmable discrete input module comprising:
    an isolator configured to isolate a pulse width modulated signal received from a pulse width modulation module configured to generate the pulse width modulated signal based upon a direct current input signal received from a voltage converter and a pulse width demodulated signal received from a pulse width demodulation module, the isolator configured to generate an isolated modulated pulse width signal based upon the pulse width modulated signal and to provide the isolated modulated pulse width signal to the pulse width demodulation module to generate the demodulated pulse width signal;

a first comparator communicatively configured to compare the demodulated pulse width signal with a first programmable reference, the first comparator configured to output a first comparator output signal based upon the comparison;

a second comparator configured to compare the demodulated pulse width signal with a second programmable reference, the second comparator configured to output a second comparator output signal based upon the comparison; and a digital filter communicatively coupled to the first comparator and the second comparator, the digital filter configured to digitally filter at least one of the first comparator output signal or the second comparator output signal to generate a discrete input signal.

7. The programmable discrete input module as recited in claim 6, wherein the digital filter comprises a microcontroller including a processor coupled with a memory having tangible computer-readable medium embodying a program executable by the processor to cause the processor to furnish digital filter functionality.

8. The programmable discrete input module as recited in claim 6, wherein the digital filter comprises a field-programmable gate array configured to furnish digital filter functionality.

9. The programmable discrete input module as recited in claim 6, wherein at least one of the first comparator or the second comparator further comprises a processor coupled with a memory having tangible computer-readable medium embodying a program executable by the processor to cause the processor to furnish comparison functionality.

10. The programmable discrete input module as recited in claim 6, wherein at least one of the first programmable reference or the second programmable reference comprise a user-selectable programmable reference configured to be programmed by a user to select a set point associated with the at least one of the first programmable reference or the second programmable reference.

11. The programmable discrete input module as recited in claim 6, wherein the isolator comprises an optical transmitter configured to emit electromagnetic radiation in a limited spectrum of wavelengths based upon the pulse width modulated signal and an optical sensor configured to detect the electromagnetic radiation in the limited spectrum of wavelengths, the optical sensor configured to generate the isolator signal in response thereto.

12. A method for generating a discrete input signal, the method comprising:

generating an isolated modulated pulse width signal based upon a pulse width modulated signal received at an isolator from a pulse width modulator module for demodulation by a pulse width demodulation module, the isolator configured to isolate the pulse width modulation module and the pulse width demodulation module;

generating a demodulated pulse width signal at the pulse width demodulation module based upon the isolated pulse width modulated signal;

generating a first comparison signal based upon a comparison of the pulse width demodulation signal and a first programmable reference at a first comparator;

generating a second comparison signal based upon a comparison of the pulse width demodulation signal and a second programmable reference at a second comparator, the first programmable reference different from the second programmable reference; and filtering at least one of the first comparison signal or the second comparison signal at a digital filter to generate the discrete input signal.

13. The method as recited in claim 12, further comprising receiving a user selection for at least one of defining a first set point for the first programmable reference or defining a second set point for the second programmable reference.

14. The method as recited in claim 12, wherein generating an isolator signal comprises emitting electromagnetic radiation in a limited spectrum of wavelengths based upon the pulse width modulated signal; and detecting the electromagnetic radiation in the limited spectrum of wavelengths at an optical sensor, the optical sensor configured to generate the isolator signal in response thereto.

* * * * *